US010388445B2

(12) United States Patent
Gao et al.

(10) Patent No.: US 10,388,445 B2
(45) Date of Patent: Aug. 20, 2019

(54) CURRENT SENSING CIRCUIT AND CURRENT SENSING ASSEMBLY INCLUDING THE SAME

(71) Applicant: EATON CORPORATION, Cleveland, OH (US)

(72) Inventors: Zhi Gao, Warrendale, PA (US); Daniel A. Hosko, Pittsburgh, PA (US); Theodore J. Miller, Oakdale, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 358 days.

(21) Appl. No.: 15/386,063

(22) Filed: Dec. 21, 2016

(65) Prior Publication Data

US 2018/0174724 A1 Jun. 21, 2018

(51) Int. Cl.
*G01R 15/18* (2006.01)
*H01F 38/20* (2006.01)
(Continued)

(52) U.S. Cl.
CPC ............ *H01F 5/02* (2013.01); *G01R 15/181* (2013.01); *H01F 27/2895* (2013.01);
(Continued)

(58) Field of Classification Search
CPC .............. G01R 15/181; G01R 19/2506; H01F 27/2895; H01F 38/20; H03H 17/04
(Continued)

(56) References Cited

U.S. PATENT DOCUMENTS 6,094,044 A * 7/2000 Kustera ................ G01R 15/181 324/127
6,624,745 B1 9/2003 Willer
(Continued)

FOREIGN PATENT DOCUMENTS

DE 10 2012 107021 A1 2/2014
DE 10 2015 216981 A1 6/2016
WO 01/82675 A2 11/2001

OTHER PUBLICATIONS

Ljubomire A. Kojovic et al., Practical Aspects of Rogowski Coil Applications to Relaying, IEEE PSRC Special Report Sponsored by the Power System Relaying Committee of the IEEE Power Engineering Society, Sep. 2010, pp. 1-72.
(Continued)

*Primary Examiner* — John E Breene
*Assistant Examiner* — Jeffrey P Aiello
(74) *Attorney, Agent, or Firm* — Eckert Seamans Cherin & Mellott, LLC

(57) ABSTRACT

A current sensing circuit for use with a Rogowski coil arranged around a conductor having a primary current includes input terminals structured to receive an output voltage of the Rogowski coil, an analog to digital converter structured to convert a differential voltage to a digital differential voltage signal, a digital integrator structured to receive the digital differential voltage signal, to implement a discrete-time transfer function that is a transform of a transfer function of an analog integrator, and to output a digital integrator output signal, and a direct current blocker filter structured to remove a direct current bias from the digital integrator output signal and to output a digital current output signal that is proportional to the primary current in the conductor.

18 Claims, 4 Drawing Sheets

(51) Int. Cl.
*H01F 5/02* (2006.01)
*H01F 27/28* (2006.01)
*G01R 19/25* (2006.01)
*H03H 17/04* (2006.01)

(52) U.S. Cl.
CPC ......... *H01F 38/20* (2013.01); *G01R 19/2506* (2013.01); *H03H 17/04* (2013.01)

(58) Field of Classification Search
USPC ............ 324/76.11, 522, 713; 702/57, 58, 64
See application file for complete search history.

(56) References Cited

U.S. PATENT DOCUMENTS 6,670,799 B1 * 12/2003 Bull ..................... G01R 15/181 324/127
7,107,158 B2 * 9/2006 Steele .................. G01N 27/002 134/1.3
7,548,836 B2 * 6/2009 Stewart ............. G01R 19/2506 702/107
8,374,366 B2 * 2/2013 Kidmose ................ H04R 3/005 381/312
8,850,887 B2 * 10/2014 Yanagisawa ........... G01C 19/56 73/504.12
2009/0206059 A1 * 8/2009 Kiko ......................... H02J 3/14 218/143
2010/0277199 A1 * 11/2010 Cusido I Roura .. G01M 13/045 324/765.01
2013/0194116 A1 * 8/2013 Oliaei ..................... H03M 3/45 341/110
2016/0178673 A1 * 6/2016 Borgwardt ......... G01R 19/2509 324/120

OTHER PUBLICATIONS

Randy Yates et al., DC Blocker Algorithms, dsp Tips&Tricks, pp. 132-134, IEEE Signal Processing Magazine, Mar. 2008.

Tao Ma et al., Rogowski Coil for Current Measurement in a Cryogenic Environment, Measurement Science Review, vol. 15, No. 2, 2015 (10.1515/msr-2015-0012), pp. 77-84, Nov. 4, 2014 Received, Accepted Apr. 30, 2015.

Alan V. Oppenheim et al., Discrete-Time Signal Processing, Second Edition, Prentice Hall Upper Saddle River, New Jersey 07458, pp. 160-163, Sampling Continuous-Time Signals, Chapter 4.

European Patent Office, International Search Report and Written Opinion (corresp. to PCT/US2017/066922), dated Apr. 3, 2018, 17 pp.

M. Faifer et al., "An Electronic Current Transformer Based on Rogowski Coil", 2008 IEEE Instrumentation and Measurement Technology Conference, Victoria, Vancouver Island, CA, May 12-15, 2008, 6 pp.

* cited by examiner

CURRENT SENSING CIRCUIT AND CURRENT SENSING ASSEMBLY INCLUDING THE SAME

BACKGROUND

Field

The disclosed concept relates generally to circuits, and in particular, to a current sensing circuit for resolving current from the output of a Rogowski coil.

Background Information

Accurate measurement of electrical current is important to numerous protection, metering, and control applications. Among numerous electrical current measurement technologies, Rogowski coil based current sensing technology has been widely used to measure alternating current (AC) or high speed current pulses in protection, metering, and monitoring applications.

FIG. 1 is an isometric view of a Rogowski coil 2. The Rogowski coil 2 includes coils wound over a non-magnetic core. As a result, the Rogowski coil does not saturate and offers a wide operating current range. The Rogowski coil 2 is arranged for use in sensing a current $i_P(t)$ flowing through a conductor 8. The output of the Rogowski coil 2 is a voltage $v_R(t)$ between its output terminals 4,6.

FIG. 2 is a circuit diagram of current sensing circuitry used with the Rogowski coil 2 of FIG. 1. The current sensing circuitry includes terminals 10,12 that connect to the output terminals 4,6 of the Rogowski coil 2 of FIG. 1. The voltage $v_R(t)$ is realized between the terminals 10,12. Ferrite beads 14,16 are electrically connected to the terminals 10,12 and suppress high frequency noise in the voltage $v_R(t)$. Outputs of the ferrite beads 14,16 are electrically connected to a resistor-capacitor-resistor shunt path including two resistors 18,20 and a capacitor 22. The two resistors 18,20 and the capacitor 22 constitute an RC-filter that acts as an analog integrator. An instrumentation amplifier 24 is electrically connected across the capacitor 22. The output voltage $v_o(t)$ of the instrumentation amplifier 24 is proportional to the current $i_P(t)$ flowing through the conductor 8.

There are some challenges with using the current sensing circuitry of FIG. 2 to resolve the current $i_P(t)$ flowing through the conductor 8 of FIG. 1. First, it is difficult to resolve the current $i_P(t)$ from the relatively small output voltage $v_R(t)$ of the Rogowski coil 2. Second, it is difficult to cope with large temperature variations, which frequently occur in circuit breaker operation.

As previously noted, the Rogowski coil 2 includes a non-magnetic core. Due to the non-magnetic core, the mutual coupling between the Rogowski coil 2 and the conductor 8 is small compared to the mutual coupling between a conductor and a current sensing element with a magnetic core such as a current transformer. This results in a small output voltage $v_R(t)$ for the Rogowski coil 2. Moreover, the use of an analog integrator, as is used in the current sensing circuitry of FIG. 2, aggravates the situation. Compared to the output voltage $v_R(t)$ of the Rogowski coil 2, the output voltage $v_o(t)$ of the instrumentation amplifier 24 is even smaller. Small voltages have smaller signal to noise ratios (SNR) than larger voltages. Therefore, the small voltages are more susceptible to noise and can cause difficulties when high precision is needed, such as in metering and control applications.

Table 1 shows a relationship between operating temperature and coil resistance for a Rogowski coil, such as the Rogowski coil 2 of FIG. 1.

TABLE 1

| Operating Temperature (° C.) | Coil Resistance (Ω) |
|---|---|
| 24.4 | 102.08 |
| 40 | 108.55 |
| 60 | 116.52 |
| 80 | 124.25 |
| 100 | 131.92 |
| 120 | 139.63 |
| 140 | 147.56 |
| 160 | 155.30 |
| 180 | 162.83 |

As shown in Table 1, variations in temperature cause changes in the coil resistance of a Rogowski coil. If the current sensing circuitry of FIG. 2 is integrated with the Rogowski coil, properties of components of the current sensing circuitry of FIG. 2, such as resistances of the two resistors 18,20, can also change due to variations in temperature. The variations in properties of the current sensing circuitry can make it difficult to accurately measure current. The temperature inside some circuit breakers can reach 160° C., so it is difficult to use the current sensing circuitry of FIG. 2 to accurately measure current in such an application.

There is room for improvement in current sensing circuitry.

SUMMARY

These needs and others are met by embodiments of the disclosed concept in which a current sensing circuit includes a digital integrator.

In accordance with one aspect of the disclosed concept, a current sensing circuit for use with a Rogowski coil arranged around a conductor having a primary current comprises: input terminals structured to receive an output voltage of the Rogowski coil; filtering elements structured to filter high frequency voltage from the output voltage and to output a filtered output voltage; an amplifier structured to receive the filtered output voltage and produce a differential voltage; an analog to digital converter structured to convert the differential voltage to a digital differential voltage signal; a digital integrator structured to receive the digital differential voltage signal, to implement a discrete-time transfer function that is a transform of a transfer function of an analog integrator, and to output a digital integrator output signal; a direct current blocker filter structured to remove a direct current bias from the digital integrator output signal and to output a digital current output signal that is proportional to the primary current in the conductor.

In accordance with another aspect of the disclosed concept, a method of implementing a digital integrator comprises providing a sampling frequency $f_s$; providing a rated supply frequency $f_e$; providing a phase difference number of samples $\Delta n$; obtaining a power grid's normalized angular frequency at rated condition using the following equation:

$$\omega_e = 2\pi\frac{f_e}{f_S}$$

obtaining a first coefficient $a_1$ based on the following equation:

$$a_1 = \frac{\cos(\Delta n \cdot \omega_e)}{\cos[(\Delta n - 1) \cdot \omega_e]}$$

obtaining a second coefficient based on the following equation:

$$b_0 = \sqrt{1 - 2a_1 \cos\omega_e + a_1^2}$$

implementing the digital integrator as a digital filter using the first coefficient $a_1$ and the second coefficient $b_0$.

In accordance with another aspect of the disclosed concept, a method of implementing a digital integrator comprises: providing a sampling frequency $f_s$; providing a rated supply frequency $f_e$; providing a phase difference number of samples $\Delta n$; obtaining a power grid's normalized angular frequency at rated condition using the following equation:

$$\omega_e = 2\pi \frac{f_e}{f_S}$$

obtaining a first coefficient $a_1$ based on the following equation:

$$a_1 = \frac{\cos\left[\left(\Delta n + \frac{1}{2}\right) \cdot \omega_e\right]}{\cos\left[\left(\Delta n - \frac{1}{2}\right) \cdot \omega_e\right]}$$

obtaining a second coefficient $b_0$ and a third coefficient $b_1$ based on the following equation:

$$b_0 = b_1 = \sqrt{\frac{1 - 2a_1 \cos\omega_e + a_1^2}{2 \cdot (1 + \cos\omega_e)}}$$

implementing the digital integrator as a digital filter using the first coefficient $a_1$, the second coefficient $b_0$, and the third coefficient $b_1$.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
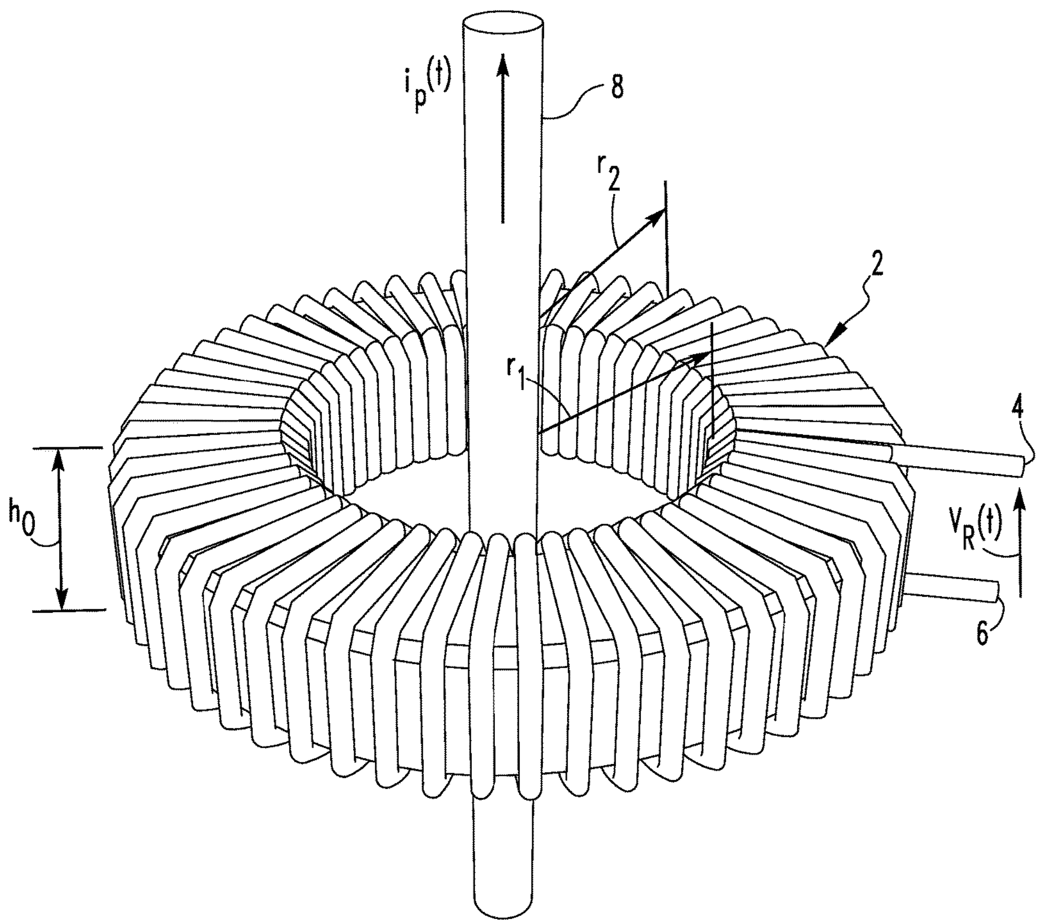
FIG. 1 is an isometric view of a Rogowski coil.

Directional phrases used herein, such as, for example, left, right, front, back, top, bottom and derivatives thereof, relate to the orientation of the elements shown in the drawings and are not limiting upon the claims unless expressly recited therein.

As employed herein, the term "processor" shall mean a programmable analog and/or digital device that can store, retrieve, and process data; a computer; a workstation; a personal computer; a microprocessor; a microcontroller; a microcomputer; a central processing unit; a mainframe computer; a mini-computer; a server; a networked processor; or any suitable processing device or apparatus.

As employed herein, the statement that two or more parts are "coupled" together shall mean that the parts are joined together either directly or joined through one or more intermediate parts.

Figure 3:
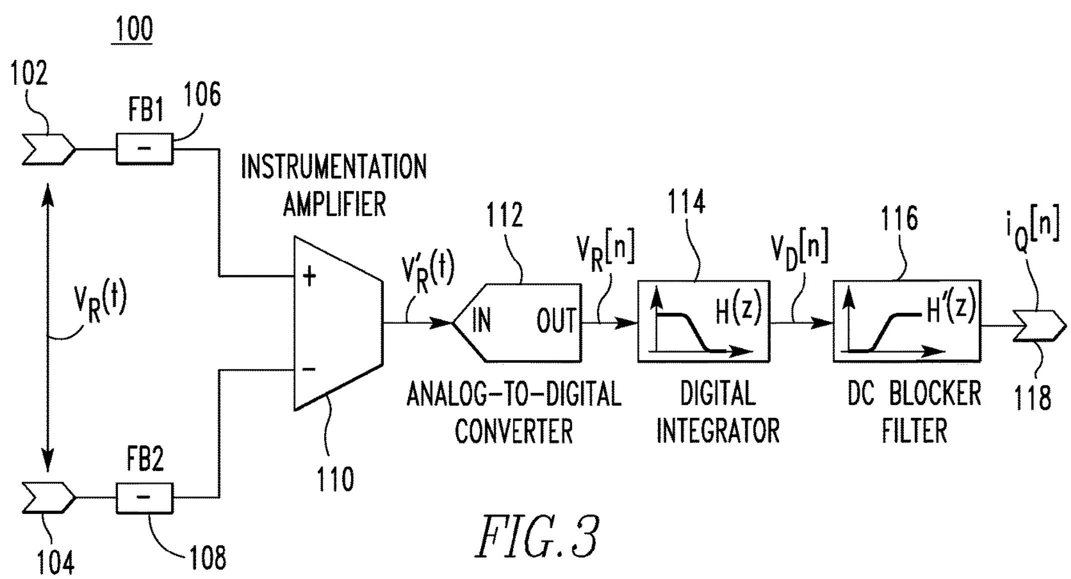
FIG. 3 is a circuit diagram of a current sensing circuit in accordance with an example embodiment of the disclosed concept.

FIG. 3 is a circuit diagram of current sensing circuitry 100 in accordance with an example embodiment of the disclosed concept. The current sensing circuitry 100 is structured to receive as input the output voltage of a Rogowski coil such as, for example and without limitation, the output voltage $v_R(t)$ of the Rogowski coil 2 of FIG. 1. The current sensing circuitry 100 includes first and second input terminals 102, 104. The first and second input terminals 102,104 may be electrically connected to output terminals of a Rogowski coil such as the output terminals 4,6, of the Rogowski coil 2 of FIG. 1. Together, the current sensing circuitry 100 and the Rogowski coil 2 form a current sensing assembly.

The current sensing circuitry 100 further includes first and second filters 106,108. The first and second filter 106,108 are respectively electrically connected to the first and second input terminals 102,104. In some example embodiments of the disclosed concept, the first and second filters 106,108 are filters structured to filter out high frequency voltage received through the first and second input terminals 102,104. In some example embodiments of the disclosed concept, the first and second filters 106,108 are ferrite beads. However, it will be appreciated by those having ordinary skill in the art that other types of filters may be employed as the first and second filters 106,108 without departing from the scope of the disclosed concept.

Outputs of the first and second filters 106,108 are electrically connected to an amplifier 110. The amplifier 110 is structured to produce a differential voltage $v'_R(t)$ from the output of the first and second filters 106,108. The differential voltage $v'_R(t)$ is a floating voltage that is the difference between the outputs of the first and second filters 106,108. The output of the amplifier 110 is electrically connected to an analog to digital converter (ADC) 112. The ADC 112 is structured to convert the differential voltage $v'_R(t)$ into a digital differential voltage signal $v_R[n]$ in a discrete-time domain.

The output of the ADC 112 is provided to a digital integrator 114 and the ADC 112 is structured to provide the digital differential voltage signal $v_R[n]$ to the digital integrator 114. The digital integrator 116 is structured to integrate the digital differential voltage signal $v_R[n]$ to produce a digital integrator output signal $v_D[n]$.

In some example embodiments of the disclosed concept, the digital integrator 114 implements a transfer function that is a discrete-time transform of the transfer function of an analog integrator. For example and without limitation, the digital integrator 114 may implement a discrete-time transform of the transfer function of the analog integrator formed by the resistors 18,20 and capacitor 22 of the current sensing circuit of FIG. 2. For example, the transfer function of the analog integrator of FIG. 2 in the s-domain is shown in Equation 1:

$$H(s)=\frac{V_o(s)}{V_R(s)}=\frac{1}{1+sCR}=\frac{\frac{1}{RC}}{s+\frac{1}{RC}}=\frac{\alpha}{s+\alpha} \quad \text{(Eq. 1)}$$

In Equation 1, H(s) is the transfer function of the analog integrator in the s-domain, $V_o(s)$ is the output of the instrumentation amplifier 24 in the s-domain and $V_R(s)$ is the output voltage of the Rogowski coil 2 in the s-domain. The capacitor 22 has a capacitance of C and the resistors 18,20 each have a resistance of R/2.

$$\alpha=\frac{1}{RC}.$$

In some example embodiments of the disclosed concept, the digital integrator 114 implements a discrete-time transform of the transfer function of an analog integrator obtained using an impulse-invariant transform. Using the analog integrator of FIG. 2 as an example, the inverse Laplace transform of the analog integrator's transfer function (H(s) shown in Equation 1) is shown in Equation 2.

$$h_a(t)=\alpha\cdot e^{-\alpha t}\cdot u(t) \quad \text{(Eq. 2)}$$

In Equation 2, $h_a(t)$ is the analog integrator's transfer function in the continuous-time domain, and u(t) is a unit step function. The discrete-time impulse response $h_d[n]$ of the analog integrator is shown in Equation 3. The quantity $T_S$ denotes a sampling interval. n denotes a temporal index, i.e., the nth sample in a discrete-time system.

$$h_d[n]=T_S\cdot h_a(nT_S) \quad \text{(Eq. 3)}$$

Equation 4 shows the result of substituting the analog integrator's transfer function in the continuous-time domain $h_a(t)$ into Equation 3.

$$h_d[n]=\alpha\cdot T_S\cdot e^{-\alpha n T_S}\cdot u[n] \quad \text{(Eq. 4)}$$

Applying the z-transform to the discrete-time impulse response $h_d[n]$ shown in Equation 4 results in the discrete-time transfer function H(z) shown in Equation 5.

$$H(z)=\frac{y(z)}{x(z)}=\frac{\alpha\cdot T_S}{1-e^{-\alpha T_S}z^{-1}}=\frac{b_0}{1-a_1z^{-1}} \quad \text{(Eq. 5)}$$

In Equation 5, x(z) and y(z) are the digital integrator's 114 input and output, respectively. In Equation 5, $$a_1=e^{-\alpha T_S}=e^{-\frac{T_S}{RC}}$$

and $b_0=\alpha\cdot T_s\cdot z^{-1}$ denotes a one-sample delay. The discrete-time transfer function H(z) shown in Equation 5 is a discrete-time transformation of the transfer function of the analog integrator of FIG. 2 obtained using an impulse-invariant transform. In some example embodiments of the disclosed concept, the digital integrator 114 implements the discrete-time transfer function H(z) shown in Equation 5.

In some example embodiments of the disclosed concept, the digital integrator 114 implements a discrete-time transform of the transfer function of an analog integrator obtained using a bilinear transform. Equation 6 is a discrete-time approximation.

$$\frac{2}{T_S}\cdot\frac{1-z^{-1}}{1+z^{-1}} \quad \text{(Eq. 6)}$$

Substituting s in Equation 1 with the discrete-time approximation shown in Equation 6 results in the discrete-time transfer function H(z) shown in Equation 7.

$$H(z)=\frac{y(z)}{x(z)}=\frac{\frac{\alpha T_S}{2+\alpha T_S}+\frac{\alpha T_S}{2+\alpha T_S}z^{-1}}{1-\frac{2-\alpha T_S}{2+\alpha T_S}z^{-1}}=\frac{b_0+b_1z^{-1}}{1-a_1z^{-1}} \quad \text{(Eq. 7)}$$

In Equation 7, $$a_1=\frac{2-\alpha T_S}{2+\alpha T_S} \text{ and } b_0=b_1=\frac{\alpha T_S}{2+\alpha T_S}.$$

Figure 2:
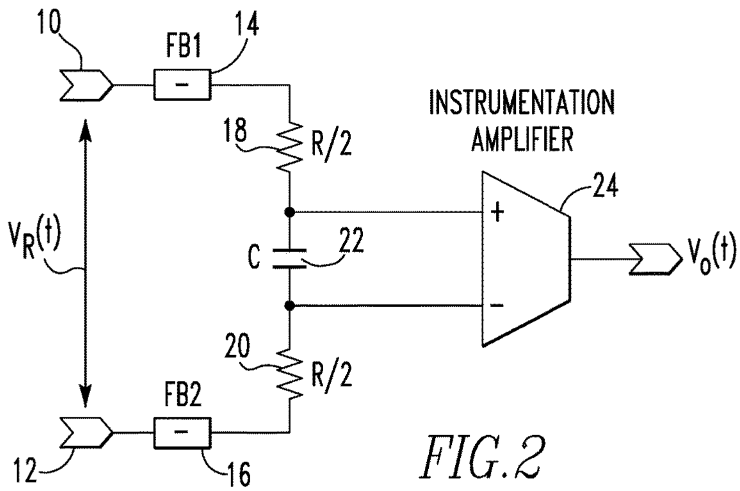
FIG. 2 is a circuit diagram of a current sensing circuit used with the Rogowski coil of FIG. 1.

The discrete-time transfer function H(z) shown in Equation 7 is a discrete-time transformation of the transfer function of the analog integrator of FIG. 2 obtained using a bilinear transform. In some example embodiments of the disclosed concept, the digital integrator 114 implements the discrete-time transfer function H(z) shown in Equation 7.

According to Equation 5, the digital integrator 114 has coefficients $a_1$ and $b_0$. In some example embodiments of the disclosed concept, the coefficients $a_1$ and $b_0$ are set based on the digital integrator's 114 phase delay.

In an example embodiment of the disclosed concept, the coefficients $a_1$ and $b_0$ of the digital integrator 114 implements a discrete-time transfer function that is an impulse-invariant transform of the transfer function of an analog integrator (e.g., without limitation, the discrete-time transfer function H(z) shown in Equation 5) and the coefficients $a_1$ and $b_0$ a set based on the phase delay of the digital integrator 114.

To compute the coefficients $a_1$ and $b_0$ in this example embodiment, it is useful to first compute the amplitude and phase response of the digital integrator 114. Equation 8 is the frequency response of the discrete-time transfer function H(z) of Equation 5 when z is replaced with $e^{j\omega}$.

$$H(e^{j\omega})=\frac{b_0}{1-a_1e^{-j\omega}}=\frac{b_0\cdot(1-a_1\cos\omega-j\cdot a_1\sin\omega)}{1-2a_1\cos\omega+a_1^2} \quad \text{(Eq. 8)}$$

From Equation 8, the digital integrator's 114 amplitude response A(ω) and phase response φ(ω) may be obtained. The amplitude response A(ω) is shown in Equation 9 and the phase response φ(ω) is shown in Equation 10.

$$A(\omega) = |H(e^{j\omega})| = \frac{b_0}{\sqrt{1 - 2a_1\cos\omega + a_1^2}} \quad \text{(Eq. 9)}$$

$$\varphi(\omega) = \angle H(e^{j\omega}) = a\tan\left(\frac{-a_1 \cdot \sin\omega}{1 - a_1\cos\omega}\right) \quad \text{(Eq. 10)}$$

The primary current $i_p(t)$ through the conductor 8 (FIG. 1) is shown in Equation 11.

$$i_P(t) = A_P \cdot \sin(2\pi f_e t) = A_P \cdot \cos(2\pi f_e t + \varphi_P) \quad \text{(Eq. 11)}$$

In Equation 11, $A_p$ is the primary current's amplitude, $f_e$ (in hertz) is the rated supply frequency, and the phase shift $\varphi_p = -\pi/2$. For a power grid with a rated supply frequency of 60 Hz, $f_e = 60$ Hz. Given the primary current $i_p(t)$ shown in Equation 11, the output voltage $v_R(t)$ of the Rogowski coil 2 is shown in Equation 12.

$$v_R(t) = M_R \cdot \frac{d}{dt} i_P(t) = 2\pi M_R A_P f_e \cos(2\pi f_e t) \quad \text{(Eq. 12)}$$

In Equation 12, $$M_R = -\frac{\mu_0 N h_0}{2\pi} \cdot \ln\frac{r_2}{r_1}$$

where $\mu_0$ is the permeability of the Rogowski coil 2, N is the number of turns of the Rogowski coil 2, $h_0$ is the height of the Rogowski coil 2, $r_2$ is an outer radius of the Rogowski coil 2, and $r_1$ is an inner radius of the Rogowski coil 2 (shown in FIG. 1).

Equation 13 shows the output voltage of the Rogowski coil 2 in the discrete-time domain.

$$v_R[n] = 2\pi M_R A_P f_e \cos(2\pi f_e \cdot n T_S) = 2\pi M_R A_P f_e \cos(\omega_e \cdot n) \quad \text{(Eq. 13)}$$

In Equation 13, $$\omega_e = 2\pi\frac{f_e}{f_s}$$

is the power grid's normalized angular frequency at rated condition. $f_s$ is the sampling frequency (in hertz) of the ADC 112. It is related to the sampling interval via $f_s = 1/T_S$. The digital integrator 114 receives the Rogowski coil's 2 output voltage signal $v_R[n]$ as an input and computes a primary current signal y[n]. Given the digital integrator's 114 amplitude and phase responses shown in Equations 9 and 10, the primary current signal y[n] from the digital integrator 114 is shown in Equation 14.

$$y[n] = 2\pi M_R A_P f_e \cdot A(\omega_e) \cdot \cos[\omega_e \cdot n + \varphi(\omega_e)] \quad \text{(Eq. 14)}$$

In Equation 14, $A(\omega_e)$ and $\varphi(\omega_e)$ are the digital integrator's 114 amplitude and phase responses at We, respectively. If $\varphi(\omega_e) = -\pi/2$, then the primary current signal y[n] is proportional to cos $$\left(\omega_e n - \frac{\pi}{2}\right) = \cos(\omega_e n + \varphi_P).$$

Equation 15 shows the phase difference (in radians) between $\varphi(\omega_e)$ and $\varphi_p$.

$$\Delta\varphi = \varphi(\omega_e) - \varphi_P = \varphi(\omega_e) + \frac{\pi}{2} \quad \text{(Eq. 15)}$$

Figure 4:
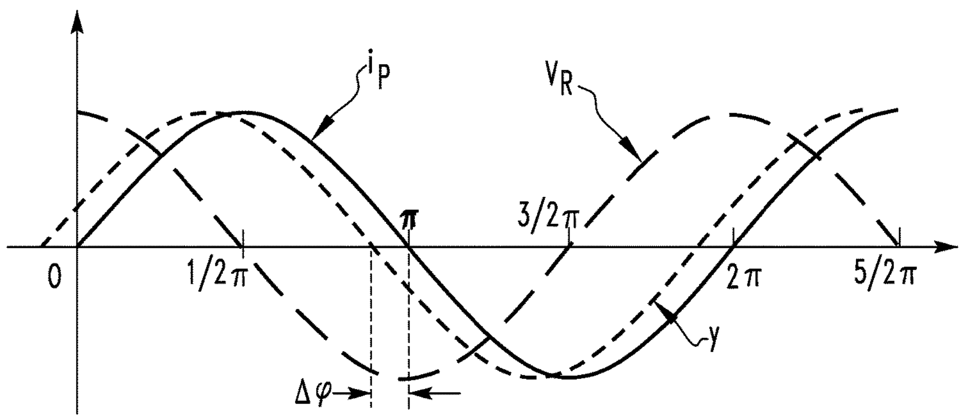
FIG. 4 is a graph of waveforms of a primary current, an output voltage of a Rogowski coil, and a primary current signal.

Note that the phase difference $\Delta\varphi$ corresponds to the phase lead between the primary current signal y[n] and the primary current $i_p(t)$ in the Rogowski coil 2. FIG. 4 illustrates waveforms of the Rogowski coil's 2 output voltage $v_R(t)$, the primary current $i_p(t)$, and the primary current signal y[n] and provides a visual illustration of the phase difference $\Delta\varphi$ between the primary current signal y[n] and the primary current $i_p(t)$.

The phase difference number of samples $\Delta n$ (i.e., the number of samples between the primary current signal y[n] and the primary current $i_p(t)$) may be determined using Equation 16.

$$\Delta n = \frac{\Delta t}{T_S} = \frac{\Delta\varphi/(2\pi f_e)}{T_S} = \frac{\Delta\varphi}{2\pi\frac{f_e}{f_S}} = \frac{\Delta\varphi}{\omega_e} \quad \text{(Eq. 16)}$$

Using Equations 10, 15, and 16 it is possible to determine a relation between $\Delta n$ and the coefficient $a_1$. The relation is shown in Equation 17.

$$a_1 = \frac{\cos(\Delta n \cdot \omega_e)}{\cos[(\Delta n - 1) \cdot \omega_e]} \quad \text{(Eq. 17)}$$

There are different ways to determine the coefficient $b_0$ once the coefficient $a_1$ has been determined. For example and without limitation, in some example embodiments of the disclosed concept, the digital integrator 114 has a unity gain at the power grid's normalized angular frequency at rated condition $\omega_e$. Using Equation 9 and setting the amplitude response $A(\omega_e)$ of the digital integrator 114 to one at the power grid's normalized angular frequency at rated condition $\omega_e$, it is possible to derive Equation 18 which shows the relation between the coefficients $a_1$ and $b_0$ when the digital integrator 114 has a unity gain at the power grid's normalized angular frequency at rated condition $\omega_e$.

$$b_0 = \sqrt{1 - 2a_1\cos\omega_e + a_1^2} \quad \text{(Eq. 18)}$$

Using Equations 17 and 18, it is possible to input phase difference number of samples $\Delta n$, the sampling frequency $f_s$, and the rated supply frequency $f_e$ to determine the coefficients $a_1$ and $b_0$. For example and without limitation, in some example embodiments of the disclosed concept, the phase difference number of samples $\Delta n$ is 1, the sampling frequency $f_s$ is 4800 Hz, and the primary current frequency $f_e$ is 60 Hz. The corresponding coefficients $a_1$ and $b_0$ are 0.9969 and 0.07846, respectively.

Table 2 shows some values of the coefficients $a_1$ and $b_0$ when the sampling frequency $f_s$ is 4800 Hz and the primary current frequency $f_e$ is 60 Hz.

TABLE 2

| Δn | $a_1$ | $b_0$ |
|---|---|---|
| 1 | 0.9969 | 0.07846 |
| 2 | 0.9907 | 0.07870 |
| 3 | 0.9845 | 0.07944 |
| 4 | 0.9781 | 0.08069 |

Figure 5:
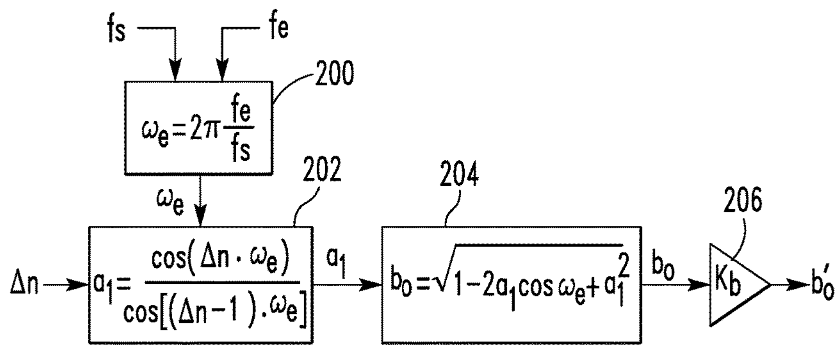
FIG. 5 is a flowchart of a method of determining coefficients of a digital integrator in accordance with an example embodiment of the disclosed concept.

FIG. 5 is a flowchart for computing the coefficients $a_1$ and $b_0$ based on the sampling frequency $f_s$, the rated supply frequency $f_e$, and the phase difference number of samples Δn when the digital integrator 114 uses a discrete-time transfer function that is an impulse-invariant transformation of the transfer function of an analog integrator. In some example embodiments of the disclosed concept, the coefficient $b_0$ may be scaled by a non-zero factor kb to a coefficient $b'_0$.

First, the sampling frequency $f_s$, the rated supply frequency $f_e$, and the phase difference number of samples Δn are provided. The power grid's normalized angular frequency at rated condition We is obtained using $$\omega_e = 2\pi \frac{f_e}{f_s}$$

at 200. The first coefficient $a_1$ is obtained using equation 17 at 202, and the second coefficient $b_0$ is obtained using equation 18 at 204. In some example embodiments of the disclosed concept, the second coefficient $b_0$ may be scaled at 206 to obtain a scaled second coefficient $b'_0$.

In some example embodiments of the disclosed concept, the sampling frequency $f_s$ is chosen as a predetermined multiple of the rated supply frequency $f_e$. In this case, the coefficients $a_1$ and $b_0$ will remain the same even if the rated supply frequency $f_e$ is changed.

Equations 8-18 are related to determining the coefficients $a_1$ and $b_0$ of the digital integrator 114 when the digital integrator 144 implements a discrete-time transfer function that is an impulse-invariant transformation of the transfer function of an analog integrator. In some example embodiments of the disclosed concept, the digital integrator 114 implements a discrete time transfer function that is a bilinear transformation of the transfer function of an analog integrator. In this case, the following equations may be used to determine the coefficients $a_1$, $b_0$, and $b_1$. In some example embodiments of the disclosed concept, the coefficients $b_0$ and $b_1$ are equal.

The discrete-time transfer function H(z) in Equation 7 is the bilinear transformation of the transfer function of an analog integrator. The frequency response of the discrete-time transfer function of Equation 7 is shown in Equation 19.

$$H(e^{j\omega}) = \frac{b_0(1+e^{-j\omega})}{1-a_1e^{-j\omega}} = \frac{b_0}{1-2a_1\cos\omega+a_1^2}\cdot[(1-a_1)\cdot(1+\cos\omega)-j\cdot(1+a_1)\cdot\sin\omega] \quad \text{(Eq. 19)}$$

From Equation 19, it is possible to determine the amplitude response and phase response, which are respectively shown in Equations 20 and 21.

$$A(\omega) = |H(e^{j\omega})| = b_0\cdot\sqrt{\frac{2\cdot(1+\cos\omega)}{1-2a_1\cos\omega+a_1^2}} \quad \text{(Eq. 20)}$$

$$\varphi(\omega) = \angle H(e^{j\omega}) = a\tan\left[\frac{-(1+a_1)\cdot\sin\omega}{(1-a_1)\cdot(1+\cos\omega)}\right] \quad \text{(Eq. 21)}$$

The phase difference Δφ and the phase difference number of samples Δn are provided by Equations 15 and 16, respectively. Using Equations 15, 16, and 21, it is possible to determine the relation between the phase difference number of samples Δn and the coefficient $a_1$, as is shown in Equation 22.

$$a_1 = \frac{\cos\left[\left(\Delta n+\frac{1}{2}\right)\cdot\omega_e\right]}{\cos\left[\left(\Delta n-\frac{1}{2}\right)\cdot\omega_e\right]} \quad \text{(Eq. 22)}$$

Assuming that the digital integrator 114 has a unity gain at $\omega_e$, the coefficient $b_0$ is provided by Equation 23.

$$b_0 = b_1 = \sqrt{\frac{1-2a_1\cos\omega_e+a_1^2}{2\cdot(1+\cos\omega_e)}} \quad \text{(Eq. 23)}$$

Table 3 shows some values for coefficients $a_1$, $b_0$, and $b_1$ when the rated supply frequency $f_e$ is 50 Hz and the sampling frequency $f_s$ is 4000 Hz (e.g., the sampling frequency $f_s$ is 80 times the rated supply frequency $f_e$).

TABLE 3

| Δn | $a_1$ | $b_0$ | $b_1$ |
|---|---|---|---|
| 1 | 0.9938 | 0.03929 | 0.03929 |
| 2 | 0.9876 | 0.03953 | 0.03953 |
| 3 | 0.9813 | 0.04003 | 0.04003 |
| 4 | 0.9748 | 0.04079 | 0.04079 |

Figure 6:
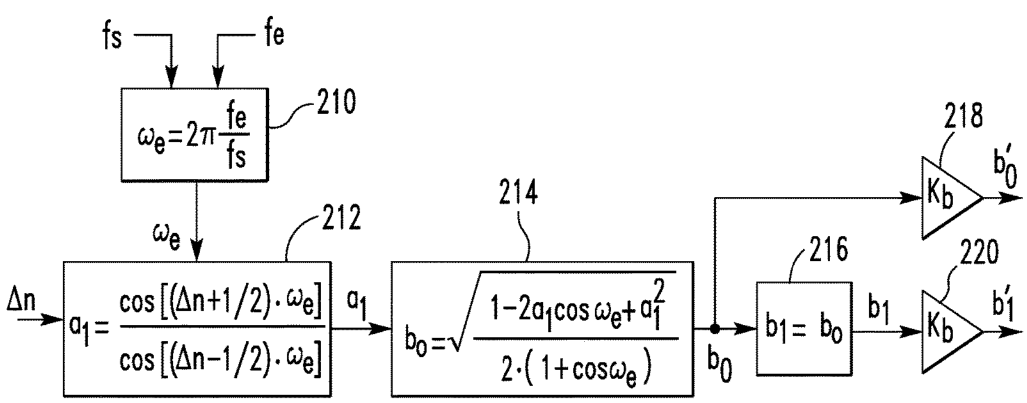
FIG. 6 is a flowchart of another method of determining coefficients of a digital integrator in accordance with an example embodiment of the disclosed concept.

FIG. 6 is a flowchart for computing the coefficients $a_1$, $b_0$, and $b_1$ based on the sampling frequency $f_s$, the rated supply frequency $f_e$, and the phase difference number of samples Δn when the digital integrator 114 uses a discrete-time transfer function that is a bilinear transformation of the transfer function of an analog integrator. In some example embodiments of the disclosed concept, the coefficients $b_0$ and $b_1$ may be scaled by a non-zero factor kb to coefficients $b'_0$ and $b'_1$.

First, the sampling frequency $f_s$, the rated supply frequency $f_e$, and the phase difference number of samples Δn are provided. The power grid's normalized angular frequency at rated condition We is obtained using $$\omega_e = 2\pi \frac{f_e}{f_s}$$

at 210. The first coefficient $a_1$ is obtained using equation 22 at 212. The second coefficient $b_0$ and the third coefficient $b_1$ are obtained using equation 23 at 214 and 216. In some example embodiments of the disclosed concept, the second coefficient $b_0$ and third coefficient $b_1$ may be scaled at 218 and 220 to obtain a scaled second coefficient $b'_0$ and a scaled third coefficient $b'_1$.

In accordance with example embodiments of the disclosed concept, the phase delay (e.g., the phase difference number of sample Δn) of the digital integrator 114 may be precisely designed and tuned. The design and tuning affords more precise control of the phase delay than analog integrators such as the one used in the current sensing circuitry shown in FIG. 2. The ability to tune the digital integrator's 114 phase delay significantly simplifies metering calibration tasks and helps meet performance constraints in protection, metering, and monitoring applications.

Referring back to FIG. 3, current sensing circuitry 100 further includes a DC blocker filter 116. The DC blocker filter 116 is structured to receive the output of the digital integrator 114. The DC blocker filter 116 is structured to filter the output of the digital integrator to remove a DC bias from the output of the digital integrator 114. The DC blocker filter 116 produces a digital current output signal $i_Q[n]$. The digital current output signal $i_Q[n]$ is proportional to the primary current $i_p(t)$.

In some example embodiments of the disclosed concept, the DC blocker filter 116 implements the transfer function shown in Equation 24.

$$H(z) = \frac{y(z)}{x(z)} = \frac{b_0 + b_1 z^{-1}}{1 - a_1 z^{-1}} \quad \text{(Eq. 24)}$$

In Equation 24, $0<a_1<1$, $b_0=1$, and $b_1=-1$. In some example embodiments of the disclosed concept, the value of $a_1$ is chosen to be close to 1 to provide reasonably good DC blocking performance.

In some example embodiments of the disclosed concept, the digital integrator 114 and the DC blocker filter 116 may be implemented as digital biquadratic filters, also referred to as a digital biquad filter. In some example embodiments of the disclosed concept, the digital biquad filter has the transfer function shown in Equation 25.

$$H(z) = \frac{y(z)}{x(z)} = \frac{b_0 + b_1 z^{-1} + b_2 z^{-2}}{1 - a_1 z^{-1} - a_2 z^{-2}} \quad \text{(Eq. 25)}$$

Table 4 shows the selection of coefficients $a_1$, $a_2$, $b_0$, $b_1$, and $b_2$ based on the type of component that is implemented in the digital biquad filter.

TABLE 4

| | Type | $a_1$ | $a_2$ | $b_0$ | $b_1$ | $b_2$ |
|---|---|---|---|---|---|---|
| Digital Integrator | Impulse-invariant transform | ≠0 | =0 | ≠0 | =0 | =0 |
| | Bilinear transform | ≠0 | =0 | ≠0 | $=b_0$ | =0 |
| | DC blocker filter | ≠0 | =0 | =1 | =−1 | =0 |

Figure 7A:
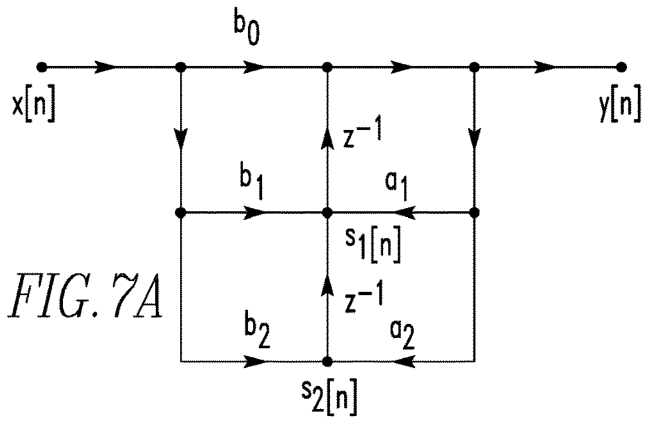
FIG. 7*a* is a signal flow graph of a digital biquadratic filter in accordance with an example embodiment of the disclosed concept.
Figure 7B:
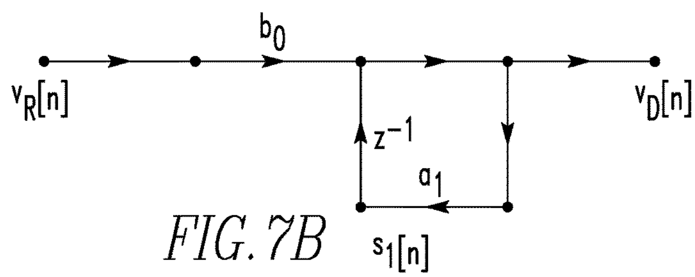
FIGS. 7*b* and 7*c* are signal flow graphs of digital integrators implemented in a digital biquadratic filter in accordance with example embodiments of the disclosed concept.
Figure 7C:
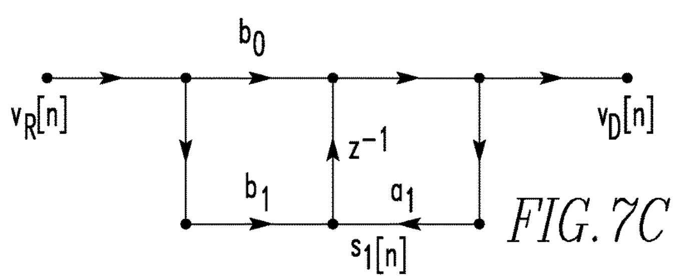
Figure 7D:
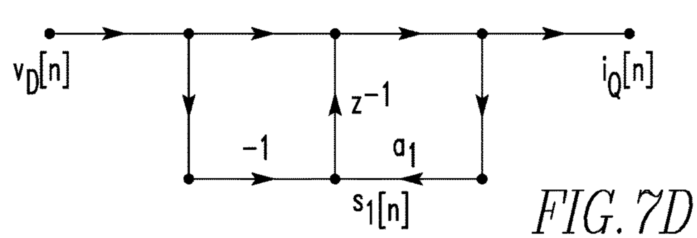
FIG. 7*d* is a signal flow graph of a DC blocker filter implemented in a digital biquadratic filter in accordance with an example embodiment of the disclosed concept.

FIG. 7*a* is a signal flow graph of a digital biquad filter in the discrete-time domain. In FIG. 7*a*, x[n] is the input to the digital biquad filter and y[n] is the output of the digital biquad filter. Applying the coefficient values in Table 4 to the signal flow graph of FIG. 7*a* produces signal flow graphs corresponding to the different types of filters that maybe implemented in the digital biquad filter. FIG. 7*b* is a signal flow graph of a digital integrator using the impulse-invariant transform. FIG. 7*c* is a signal flow graph of a digital integrator using a bilinear transform, and FIG. 7*d* is a signal flow graph of a DC blocker filter.

In some example embodiments of the disclosed concept, the digital integrator output signal $v_D[n]$ of the digital integrator 114 may be used for the purpose of circuit protection and the digital current output signal $i_Q[n]$ is proportional to the primary current $i_p(t)$ and may be used for metering or control purposes. However, it will be appreciated by those having ordinary skill in the art that the outputs $v_D[n]$ and $i_Q[n]$ may be used for any purpose without departing from the scope of the disclosed concept.

The ADC 112 may be implemented using any suitable electronic components such as, for example and without limitation, an integrated circuit and/or other circuit components. The digital integrator 114 and the DC blocker filter 116 may be implemented using any suitable electronic components such as, for example and without limitation, microchips, other circuit components, and/or electronic components used in digital filtering applications. One or more of the ADC 112, the digital integrator 114, and the DC blocker filter 116 may be implemented using any suitable components. For example and without limitation, one or more of the ADC 112, the digital integrator 114, and the DC blocker filter 116 may be implemented in a processor. The processor may have an associated memory. The processor may be, for example and without limitation, a microprocessor, a microcontroller, or some other suitable processing device or circuitry, that interfaces with the memory or another suitable memory. The memory may be any of one or more of a variety of types of internal and/or external storage media such as, without limitation, RAM, ROM, EPROM(s), EEPROM(s), FLASH, and the like that provide a storage register, i.e., a machine readable medium, for data storage such as in the fashion of an internal storage area of a computer, and can be volatile memory or nonvolatile memory. The memory may store one or more routines which, when executed by the processor, cause the processor to implement at least some of its functionality.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A current sensing circuit for use with a Rogowski coil arranged around a conductor having a primary current, the current sensing circuit comprising:

input terminals structured to receive an output voltage of the Rogowski coil;

filtering elements structured to filter high frequency voltage from the output voltage and to output a filtered output voltage;

an amplifier structured to receive the filtered output voltage and produce a differential voltage;

an analog to digital converter structured to convert the differential voltage to a digital differential voltage signal;

a digital integrator structured to receive the digital differential voltage signal, to implement a discrete-time transfer function that is a transform of a transfer function of an analog integrator, and to output a digital integrator output signal;

a direct current blocker filter structured to remove a direct current bias from the digital integrator output signal and to output a digital current output signal that is proportional to the primary current in the conductor, and wherein the discrete-time transform implemented by the digital integrator is an impulse-invariant transform of the transfer function of the analog integrator, and wherein the analog integrator is an RC-filter having a resistance of R and a capacitance of C; and wherein the discrete-time transfer function of the digital integrator is defined by the following equation:

$$H(z)=\frac{y(z)}{x(z)}=\frac{\alpha\cdot T_S}{1-e^{-\alpha T_S}z^{-1}}=\frac{b_0}{1-a_1z^{-1}}$$

where $T_s$ is a sampling interval;

$$\alpha=\frac{1}{RC};\ a_1=e^{-\alpha T_S}=e^{-\frac{T_S}{RC}};\ b_0=\alpha\cdot T_S;$$

and $z^{-1}$ denotes a one-sample delay.

2. The current sensing circuit of claim 1, wherein the digital integrator has coefficients of $a_1$ and $b_0$; wherein $a_1$ is defined by the following equation:

$$a_1=\frac{\cos(\Delta n\cdot\omega_e)}{\cos[(\Delta n-1)\cdot\omega_e]}$$

wherein $b_0$ is defined by the following equation:

$$b_0=\sqrt{1-2a_1\cos\omega_e+a_1^2}$$

wherein $\Delta n$ is a phase difference number of samples;

$$\omega_e=2\pi\frac{f_e}{f_s},$$

$f_e$ is a rated supply frequency, and $f_s$ is a sampling frequency of the analog to digital converter.

3. The current sensing circuit of claim 1, wherein the direct current blocker filter has a transfer function defined by the following equation:

$$H(z)=\frac{y(z)}{x(z)}=\frac{b_0+b_1z^{-1}}{1-a_1z^{-1}}$$

where $0<a_1<1$, $b_0=1$, and $b_1=-1$.

4. The current sensing circuit of claim 1, wherein at least one of the digital integrator and the direct current blocker filter are implemented with a digital biquadratic filter having a transfer function defined by the following equation:

$$H(z)=\frac{y(z)}{x(z)}=\frac{b_0+b_1z^{-1}+b_2z^{-2}}{1-a_1z^{-1}-a_2z^{-2}}$$

where $z^{-1}$ denotes a one sample delay, $z^{-2}$ denotes a two sample delay, and $a_1$, $a_2$, $b_0$, $b_1$, and $b_2$ are coefficients.

5. The current sensing circuit of claim 4, wherein the digital integrator is implemented with the digital biquadratic filter; wherein the discrete-time transform implemented by the digital integrator is an impulse-invariant transform of the transfer function of the analog integrator; and wherein $a_1\neq0$, $a_2=0$, $b_0\neq0$, $b_1=0$, and $b_2=0$.

6. The current sensing circuit of claim 4, wherein the digital integrator is implemented with the digital biquadratic filter; wherein the discrete-time transform implemented by the digital integrator is a bilinear transform of the transfer function of the analog integrator; and wherein $a_1\neq0$, $a_2=0$, $b_0\neq0$, $b_1=b_0$, and $b_2=0$.

7. The current sensing circuit of claim 4, wherein the direct current blocker filter is implemented with the digital biquadratic filter; and wherein $a_1\neq0$, $a_2=0$, $b_0=1$, $b_1=-1$, and $b_2=0$.

8. A current sensing circuit for use with a Rogowski coil arranged around a conductor having a primary current, the current sensing circuit comprising:

input terminals structured to receive an output voltage of the Rogowski coil;

filtering elements structured to filter high frequency voltage from the output voltage and to output a filtered output voltage;

an amplifier structured to receive the filtered output voltage and produce a differential voltage;

an analog to digital converter structured to convert the differential voltage to a digital differential voltage signal;

a digital integrator structured to receive the digital differential voltage signal, to implement a discrete-time transfer function that is a transform of a transfer function of an analog integrator, and to output a digital integrator output signal;

a direct current blocker filter structured to remove a direct current bias from the digital integrator output signal and to output a digital current output signal that is proportional to the primary current in the conductor, and wherein the discrete-time transform implemented by the digital integrator is a bilinear transform of the transfer function of the analog integrator, and wherein the analog integrator is an RC-filter having a resistance of R and a capacitance of C; and wherein the discrete-time transfer function of the digital integrator is defined by the following equation:

$$H(z)=\frac{y(z)}{x(z)}=\frac{\frac{\alpha T_S}{2+\alpha T_S}+\frac{\alpha T_S}{2+\alpha T_S}z^{-1}}{1-\frac{2-\alpha T_S}{2+\alpha T_S}Z^{-1}}=\frac{b_0+b_1z^{-1}}{1-a_1z^{-1}}$$

where $T_s$ is a sampling interval;

$$\alpha=\frac{1}{RC};\ a_1=\frac{2-\alpha T_s}{2+\alpha T_s},\ b_0=b_1=\frac{\alpha T_s}{2+\alpha T_s},$$

and $z^{-1}$ denotes a one-sample delay.

9. The current sensing circuit of claim 8, wherein the digital integrator has coefficients of $a_1$, $b_0$, and $b_1$; wherein $a_1$ is defined by the following equation:

$$a_1=\frac{\cos\left[\left(\Delta n+\frac{1}{2}\right)\cdot\omega_e\right]}{\cos\left[\left(\Delta n-\frac{1}{2}\right)\cdot\omega_e\right]}$$

and wherein b0 and b1 are defined by the following equation:

$$b_0=b_1=\sqrt{\frac{1-2a_1\cos\omega_e+a_1^2}{2\cdot(1+\cos\omega_e)}}$$

wherein Δn is a phase difference number of samples;

$$\omega_e = 2\pi\frac{f_e}{f_s},$$

$f_e$ is a rated supply frequency, and $f_s$ is a sampling frequency of the analog to digital converter.

10. A current sensing circuit for use with a Rogowski coil arranged around a conductor having a primary current, the current sensing circuit comprising:

input terminals structured to receive an output voltage of the Rogowski coil;

filtering elements structured to filter high frequency voltage from the output voltage and to output a filtered output voltage;

an amplifier structured to receive the filtered output voltage and produce a differential voltage;

an analog to digital converter structured to convert the differential voltage to a digital differential voltage signal;

a digital integrator structured to receive the digital differential voltage signal, to implement a discrete-time transfer function that is a transform of a transfer function of an analog integrator, and to output a digital integrator output signal;

a direct current blocker filter structured to remove a direct current bias from the digital integrator output signal and to output a digital current output signal that is proportional to the primary current in the conductor, and wherein the filtering elements include at least one ferrite bead.

11. A method of implementing a digital integrator, the method comprising:

providing a sampling frequency $f_s$;

providing a rated supply frequency $f_e$;

providing a phase difference number of samples Δn;

obtaining a power grid's normalized angular frequency at rated condition using the following equation:

$$\omega_e = 2\pi\frac{f_e}{f_s}$$

obtaining a first coefficient $a_1$ based on the following equation:

$$a_1 = \frac{\cos(\Delta n \cdot \omega_e)}{\cos[(\Delta n - 1)\cdot\omega_e]}$$

obtaining a second coefficient based on the following equation:

$$b_0 = \sqrt{1 - 2a_1\cos\omega_e + a_1^2}$$

implementing the digital integrator as a digital filter using the first coefficient $a_1$ and the second coefficient $b_0$.

12. The method of claim 11, further comprising:

scaling the second coefficient $b_0$ to obtain a scaled second coefficient $b'_0$; and implementing the digital integrator using the scaled second coefficient $b'_0$.

13. The method of claim 11, wherein the digital integrator is an impulse invariant transform of an analog integrator.

14. The method of claim 11, wherein implementing the digital integrator further comprises implementing the digital integrator in a current sensing circuit for sensing a primary current in a conductor based on a voltage output of a Rogowski coil arranged around the conductor.

15. A method of implementing a digital integrator, the method comprising:

providing a sampling frequency $f_s$;

providing a rated supply frequency $f_e$;

providing a phase difference number of samples Δn;

obtaining a power grid's normalized angular frequency at rated condition using the following equation:

$$\omega_e = 2\pi\frac{f_e}{f_s}$$

obtaining a first coefficient $a_1$ based on the following equation:

$$a_1 = \frac{\cos\left[\left(\Delta n + \frac{1}{2}\right)\cdot\omega_e\right]}{\cos\left[\left(\Delta n - \frac{1}{2}\right)\cdot\omega_e\right]}$$

obtaining a second coefficient $b_0$ and a third coefficient $b_1$ based on the following equation:

$$b_0 = b_1 = \sqrt{\frac{1 - 2a_1\cos\omega_e + a_1^2}{2\cdot(1+\cos\omega_e)}}$$

implementing the digital integrator as a digital filter using the first coefficient $a_1$, the second coefficient $b_0$, and the third coefficient $b_1$.

16. The method of claim 15, further comprising:

scaling the second coefficient $b_0$ to obtain a scaled second coefficient $b'_0$;

scaling the third coefficient $b_1$ to obtain a scaled third coefficient $b'_1$; and implementing the digital integrator using the scaled second coefficient $b'_0$ and the scaled third coefficient $b'_1$.

17. The method of claim 15, wherein the digital integrator is a bilinear transform of an analog integrator.

18. The method of claim 15, wherein implementing the digital integrator further comprises implementing the digital integrator in a current sensing circuit for sensing a primary current in a conductor based on a voltage output of a Rogowski coil arranged around the conductor.

* * * * *